US006594508B1

(12) United States Patent
Ketonen

(10) Patent No.: US 6,594,508 B1
(45) Date of Patent: Jul. 15, 2003

(54) ANTENNA AND CABLE MONITORING FOR RADIO BASE STATION

(75) Inventor: Veli-Pekka Ketonen, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/540,911

(22) Filed: Mar. 31, 2000

(51) Int. Cl.$^7$ ................................................ H04B 1/38
(52) U.S. Cl. ........................ 455/561; 455/422; 455/523
(58) Field of Search .......................... 455/561, 14, 422, 455/523

(56) References Cited

U.S. PATENT DOCUMENTS

| 5,548,820 A | 8/1996 | Victorin ..................... 455/67.4 |
| 5,826,179 A | 10/1998 | Lindenmeier et al. ... 455/277.2 |

FOREIGN PATENT DOCUMENTS

| EP | 0 718 981 A2 | 6/1996 |
| EP | 0 844 485 A2 | 5/1998 |
| WO | WO 95/19574 | 7/1995 |

*Primary Examiner*—Thanh Cong Le
*Assistant Examiner*—Thuan T. Nguyen
(74) *Attorney, Agent, or Firm*—T. Brooke Hayes

(57) ABSTRACT

A method and apparatus for providing an antenna condition signal and a feeder cable condition signal in a base station having an antenna coupled to a cabinet by an antenna feeder cable. Two directional couplers are configured to detect forward and reflected signals to and from the antenna. Power detectors are coupled to the RF couplers, and are configured to provide forward and reflected power signals. A first differential amplifier provides a detector tuning signal proportional to the difference between the forward and reflected power signals. A second differential amplifier provides a detector tuning signal proportional to the difference between the forward and a reference voltage. Each differential amplifier tunes a voltage controlled oscillator (VCO). The output of the VCOs is coupled to the feeder cable. A phase locked loop at the cabinet is coupled to the feeder cable and provides a recovery tuning signal which tracks the tuning signals to the differential amplifiers.

36 Claims, 8 Drawing Sheets

ANTENNA AND CABLE MONITORING FOR RADIO BASE STATION

BACKGROUND OF THE INVENTION

1. Field of the Invention

The present invention relates to cellular communication, and more specifically to a method and apparatus for accurately detecting and reporting cellular base station antenna conditions.

2. Relevant Background

One of the most common sources of cellular communication problems is antenna and feeder cable failure at a cellular base station. A base station is typically exposed to many harsh environmental conditions which take their toll on the antenna and/or antenna feeder cable over time. Some of the more common causes of antenna and cable failure include corrosion from moisture, fatigue due to temperature changes, and stress from wind, hail, and lightning strikes. In addition, some gun owners are known to prefer base stations over conventional bottle and can targets when target practicing. These factors can lead to a slow degradation in antenna and/or feeder cable performance over time, or may cause complete failure all at once. In either case, a method for early detection of antenna and cable problems is critical in providing reliable cellular communication services.

A known method of detecting base station antenna and/or feeder cable failure is by monitoring cellular traffic at base stations. A sharp drop in traffic is a good indication that a base station failure has occurred. When such a drop in traffic occurs, a technician can be sent to the base station to investigate possible antenna and cable problems. This method, however, is not helpful when a base station failure occurs in low cellular traffic locations, such as rural areas. In these areas, a lack of cellular activity may seem normal, and an antenna and/or cable failure may therefore not be noticed for long periods of time. Moreover, a slow degradation in antenna or cable performance may be difficult to identify by monitoring cellular traffic levels. A gradual decrease in cellular traffic can be caused by many factors, and may be impossible to correlate to a degradation in antenna or cable performance. What is therefore needed is a method to alert a cellular service provider of base station antenna and cable problems in low cellular traffic regions. What is also needed a method to accurately detect a gradual degradation in antenna and cable performance over time.

Another known method of detecting base station antenna and feeder cable problems is to routinely and periodically test the condition of base stations by a technician. For example, a technician may visit a base station every six months and perform various antenna and cable tests in an effort to determine the base station's operating condition. Among these tests, perhaps the most important measurements taken are a return loss reading of the antenna (also referred to as the reflection coefficient or standing wave ratio) and a cable loss reading of the antenna feeder cable.

Return loss occurs when a portion of a signal being passed to an antenna is reflected back to the source. Return loss can be measured as the difference between amount of original signal input to an antenna and the amount of signal reflected back by the antenna. A large amount of reflected signal is undesirable since the amount of signal ultimately transmitted by the antenna is lower, thereby decreases the antenna's effectiveness. Return loss is generally caused by impedance mismatching between the antenna and the signal source.

Typically, the input impedance of an antenna is matched to the output impedance of the signal source during antenna installation, thus minimizing any return loss. When an antenna is damaged however, its impedance changes, causing antenna and source impedances to become mismatched. As a result, the return loss of the antenna increases. Thus, measuring return loss is a method of determining if any antenna damage has occurred.

Cable loss describes the drop in signal strength across a cable, and can be measured as the difference between amount of original signal input to a cable and the amount of signal output by the cable. The difference between these two values is the cable loss of feeder cable. Several factors contribute to cable loss, including the cable's dimensions, the ambient temperature, and the frequency of the signal input to the cable. In general, damaged antenna feeder cables have higher cable loss, and deliver weaker signals to the antenna. Therefore, measuring cable loss is helpful in determining whether damage to an antenna feeder cable exists.

A shortcoming of sending a technician to perform periodic antenna diagnostic measurements is that an antenna and/or cable failure may potentially go undetected for long periods of time. Increasing the number of technician visits can help detect base station antenna and cable problems in a more timely basis, but this also increases the cost of maintaining the base station dramatically. In addition, manually measuring antenna return loss and cable loss can be a dangerous undertaking. Often times, cellular antennas are mounted on high towers or other difficult to reach peaks, and technicians must climb to these antenna locations in order to accurately measure return loss and cable loss.

What is therefore needed is a method to detect antenna and cable damage quickly and accurately in a safe and efficient manner which overcomes the shortcomings of the prior art.

SUMMARY OF THE INVENTION

Briefly stated, the present invention involves base station having an antenna coupled to a cabinet through a feeder cable. The base station includes an antenna forward signal power detector adapted to output an antenna forward power signal for signals traveling from the cabinet to the antenna. An antenna reflected signal power detector is adapted to output an antenna reflected power signal for signals traveling from the antenna to the cabinet. An antenna return loss signal is provided which is proportional to a difference between the antenna forward power signal and the antenna reflected power signal. A return loss oscillator is configured to modulate the antenna return loss signal, and the oscillator is coupled to the feeder cable. A cabinet circuit is coupled to the feeder cable. The cabinet circuit is configured to restore said antenna return loss signal. The base station may further include a cable loss oscillator configured to modulate the antenna forward power signal. The cable loss oscillator is also coupled to the feeder cable.

Another aspect of the present invention is a base station having an antenna coupled to a cabinet through a feeder cable. An antenna forward signal power detector is adapted to output an antenna forward power signal for signals traveling from the cabinet to the antenna. An ending cable loss signal is generated which is proportional to a difference between the antenna forward power signal and an antenna voltage reference. A cable loss oscillator is configured to modulate the ending cable loss signal. The oscillator coupled to the feeder cable. A cabinet circuit, also coupled to the feeder cable, is configured to restore said ending cable loss signal. The cabinet circuit may further include a cabinet forward signal power detector adapted to output a beginning cable loss signal for signals traveling from the cabinet to the antenna, and a cable loss status signal proportional to a difference between the beginning cable loss signal and the ending cable loss signal.

Another aspect of the prevent invention is a base station which contains an antenna coupled to a cabinet through a feeder cable. The base station includes a first RF coupler configured to detect forward signals traveling from the cabinet to the antenna. A second RF coupler is configured to detect reflected signals traveling from the antenna to the cabinet. A first power detector is coupled to the first RF coupler and is configured to provide a forward power signal of the forward signals. A second power detector is coupled to the second RF coupler and is configured to provide a reflected power signal of the reflected signals. A differential amplifier is coupled to the forward power signal at a non-inverting input and is coupled to the reflected power signal at an inverting input. The differential amplifier provides a detector tuning signal which is an amplified difference between the forward power signal and the reflected power signal. A voltage controlled oscillator is coupled to the detector tuning signal at a detector oscillator input and is coupled to the feeder cable at a detector oscillator output signal.

The base station may further include a phase detector having a first phase detector input, a second phase detector input, and phase detector output. The first phase detector input is coupled to the feeder cable. The phase detector output provides a recovery tuning signal proportional to a phase difference between the first phase detector input and the second phase detector input. A second-voltage controlled oscillator is coupled to the recovery tuning signal at the oscillator's input and is coupled to the second phase detector input at the oscillator's output. The phase detector and the second voltage controlled oscillator form a phase locked loop such that the recovery tuning signal tracks the detector tuning signal.

Another aspect of the present invention is a method for providing an antenna condition signal in a base station having an antenna coupled to a cabinet by an antenna feeder cable. The method includes the steps of: detecting the power level of a forward signal traveling to the antenna; detecting the power level of a reflected signal traveling from the antenna; providing a detector signal proportional to a difference between the power level of the forward signal and the power level of the reflected signal; tuning a carrier signal to a frequency corresponding to the detector signal; and inserting the carrier signal into the antenna feeder cable.

In addition, the method may further include the steps of extracting the carrier signal from the antenna feeder cable; providing a recovered signal proportional to a difference in phase between the extracted carrier signal and a reference signal; and tuning the reference signal to a frequency corresponding to the recovered signal.

Another embodiment of the present invention is a method for providing an cable condition signal of a feeder cable. The method includes the steps of: detecting a first power level of a forward signal proximate the antenna end of the feeder cable; forming a first cable loss signal responsive to a difference between said first power level of said forward signal and a first voltage reference; tuning a carrier signal to a frequency responsive to said first cable loss signal; and applying said carrier signal into said feeder cable.

In addition, the method may further include the steps of: extracting said carrier signal from said feeder cable; recovering said first cable loss signal from said carrier signal; detecting a second power level of said forward signal proximate the cabinet end of the feeder cable; forming a second cable loss signal responsive to a difference between said second power level of said forward signal and a second voltage reference; and forming a feeder cable status signal proportional to a difference between said second cable loss signal and said recovered first cable loss signal.

DETAILED DESCRIPTION OF THE INVENTION

Figure 1:
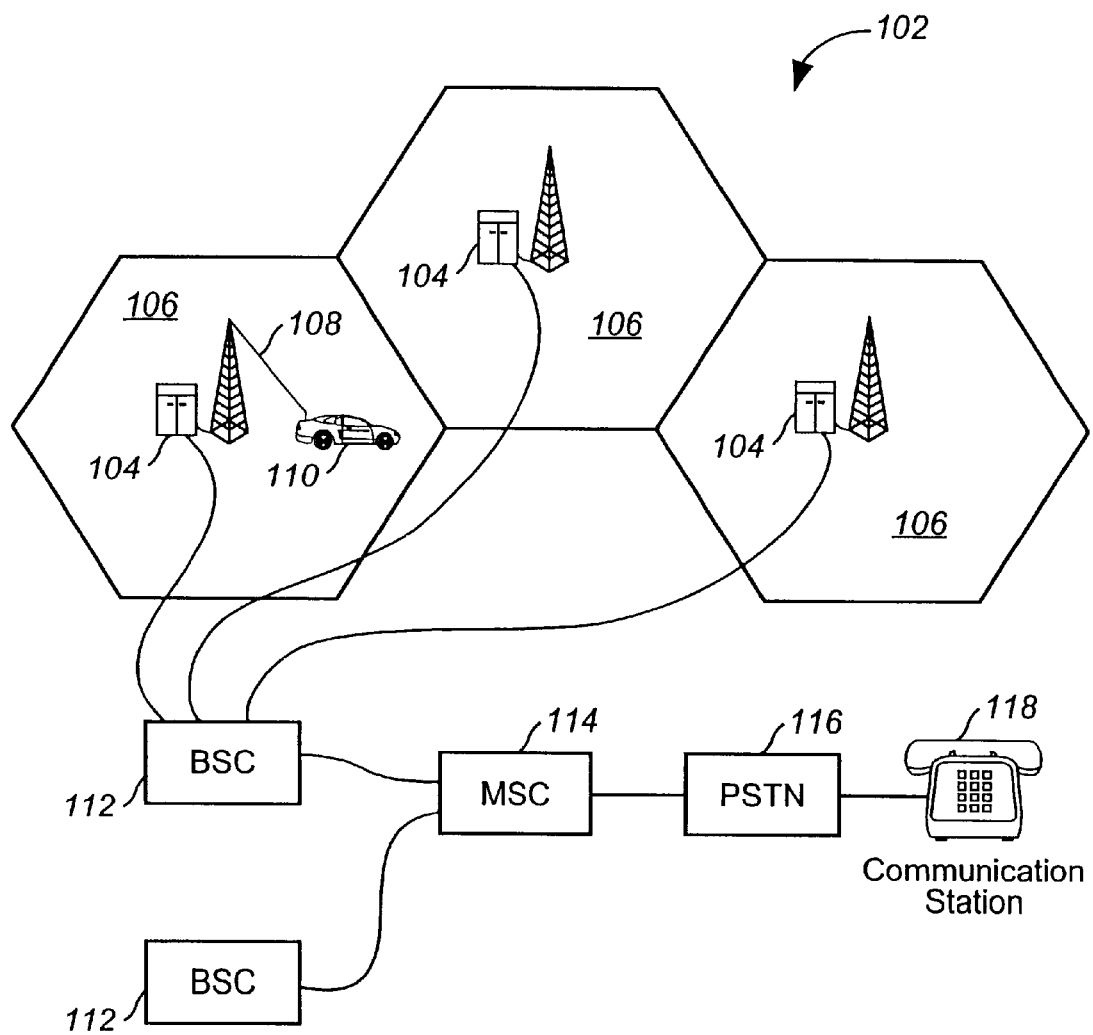
FIG. 1 shows a portion of an exemplary wireless cellular communication system as contemplated by the present invention.

Referring first to FIG. 1, a portion of an exemplary wireless cellular communication system 102 as contemplated by the present invention is shown. The system 102 includes a number of base stations 104 spaced throughout a geographical area, with each base station 104 defining a cell 106. The cells 106 collectively cover the area encompassed by the cellular communication system 102. Each base station 104 establishes a radio link 108 with various wireless mobile devices 110, such as cellular phones, pagers, and personal digital assistants (PDAs), located within its particular cell 106. The base station 104 transmits and receives voice and other data to and from each wireless device 110 as necessary to effectuate wireless communication.

Groups of base stations 104 are coupled to a base station controller (BSC) 112. A BSC 112 is operable to control radio base stations coupled thereto. Groups of BSCs 112 are coupled, in turn, to a mobile switching center (MSC) 114. A MSC 114 performs switching operations and is coupled to a public-switched telephone network (PSTN) 116. The PSTN 116 is coupled to communication stations 118, such as the conventional wire-line telephone shown. Telephonic communication is effectuated between, for instance, the mobile station 110 and the communication station 118 by way of the PSTN 116 and the network infrastructure including the MSC 114, the BSC 112, and the radio base station 104 to which the mobile station 110 is coupled by way of a radio link 108 formed between the mobile station 110 and the radio base station 104.

It is also possible to implement the present invention using other conventional cellular system configurations. For example, each cell 106 may be divided into several sectors such that more than one base station 104 is used to communicate in a given cell. Furthermore, a base station 104 may be configured to span over several adjoining cell sectors located in different cells 106 such that each base station 104 is shared with more than one cell region. These and other implementations are considered equivalent to the specific embodiments disclosed herein.

Figure 2:
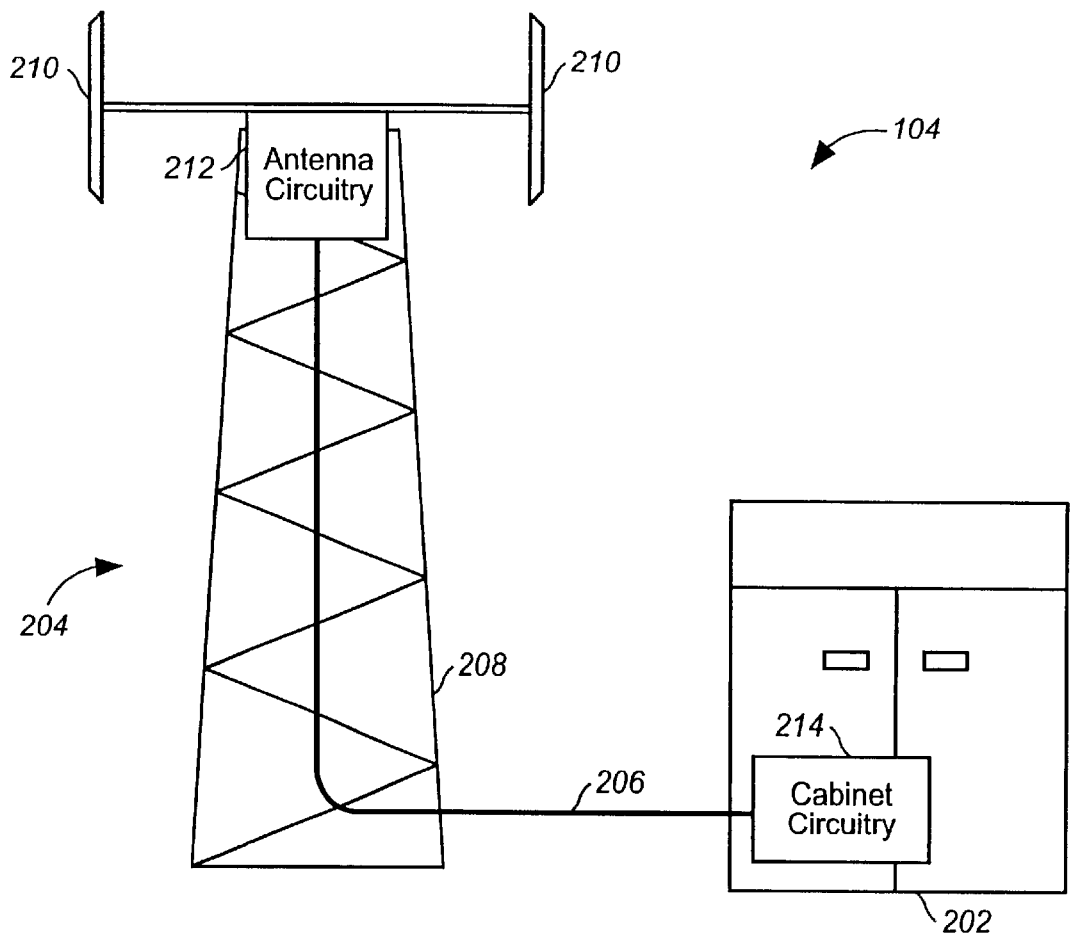
FIG. 2 shows an embodiment of a base station incorporating the present invention.

FIG. 2 shows an embodiment of a base station 104 incorporating the present invention. The base station 104 includes a cabinet 202 and an antenna assembly 204. The antenna assembly 204 includes a tower 208, at least one antenna 210, and various support structures, such as hangers and flanges. The antenna assembly 204 also includes antenna circuitry 212 coupled to the antenna 210. The cabinet 202 encloses most of the electrical components necessary to transmit and detect data signals to and from the mobile devices, such as power supplies, oscillators, amplifiers, and filters (not shown). The cabinet 202 also includes cabinet circuitry 214 which is coupled to the antenna circuitry 212 through an antenna feeder cable 206.

In one embodiment of the present invention, the power level of a transmitted signal and its reflected signal is measured by the antenna circuitry 212 during signal transmission. Preferably, the antenna circuitry 212 is positioned close to the antenna input. By doing so, the power levels of the transmitted and the reflected signals are more accurately measured since cable loss between the antenna and the antenna circuitry 212 is minimized. The reflected signal power level is subtracted from the transmitted power level and the resulting value is passed to the cabinet circuitry 214 through the feeder cable 206. This value is then used to evaluate whether antenna damage exits.

In another embodiment, the cabinet circuitry 214 is configured to measure the power level of a signal before entering the feeder cable 206. The antenna circuitry 212 is configured to measure the power level of the signal after exiting the feeder cable 206. The measured power level at the antenna circuitry 212 is passed to the cabinet circuitry 214 where the power levels at both ends of the cable 206 are compared. The compared power levels provide a cable loss measurement which can be used to determine whether feeder cable damage exists.

The antenna circuitry 212 and the cabinet circuitry 214 are discussed in more detail below.

Figures 3A, 3B, 3C:
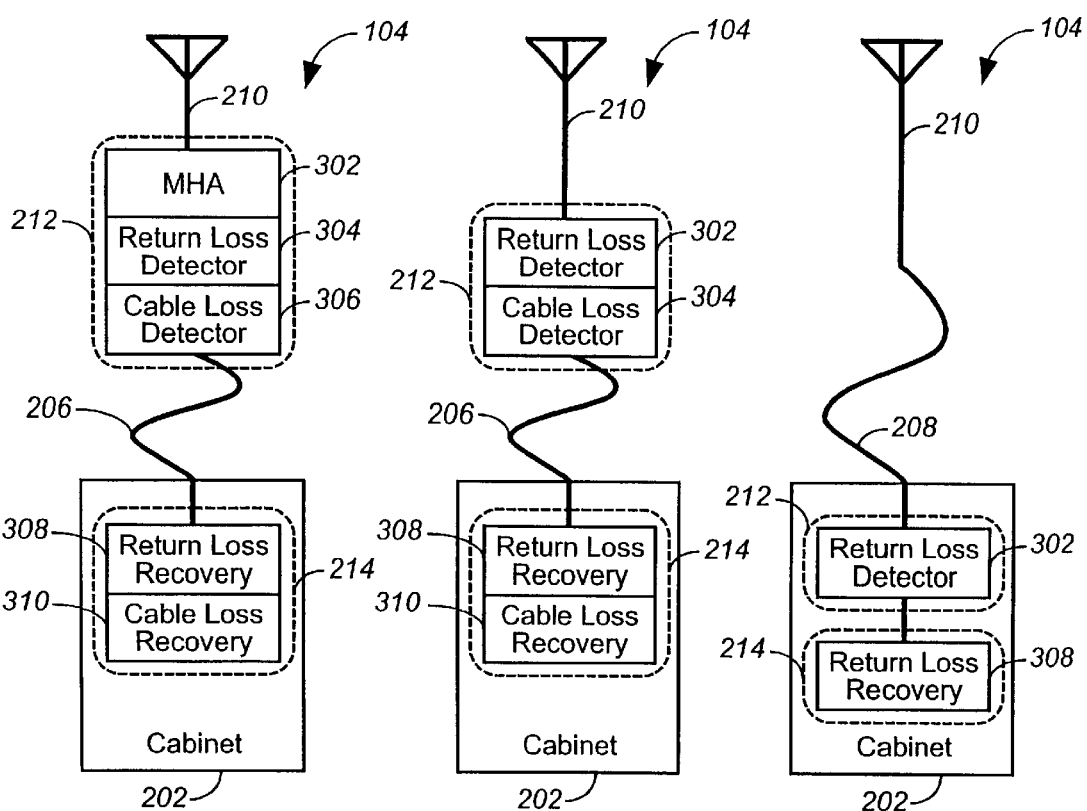
FIGS. 3A, 3B, and 3C show examples of different embodiments of the present invention.

In FIGS. 3A, 3B, and 3C, examples of different base station embodiments of the present invention are shown. In FIG. 3A, a base station 104 is shown having antenna circuitry 212 located proximate the antenna 210, and cabinet circuitry 214 located within the base station cabinet 202. The antenna circuitry 212 contains a mast head amplifier (MHA) 302, a return loss detector 304, and a cable loss detector 306. The cabinet circuitry 214 of FIG. 3A includes a return loss recovery circuit 308 and a cable loss recovery circuit 310. This configuration is well suited for base stations with high cable loss at the feeder cable 206.

In FIG. 3B, the antenna circuitry 212 of the base station 104 is shown to include a return loss detector 304 and a cable loss detector 306 located proximate the antenna 210, but without the mast head amplifier. This configuration is also suitable for base stations with high cable loss at the feeder cable 206, but which do not require amplification of reverse link signals (signals from a mobile station to the base station).

In FIG. 3C, a base station 104 is shown with both the antenna circuitry 212 and the cabinet circuitry 214 located at the base station cabinet 202. The base station 104 of FIG. 3C is not configured to measure cable loss through the feeder cable 206. Such an embodiment can be used where cable loss is relatively low.

Figure 4:
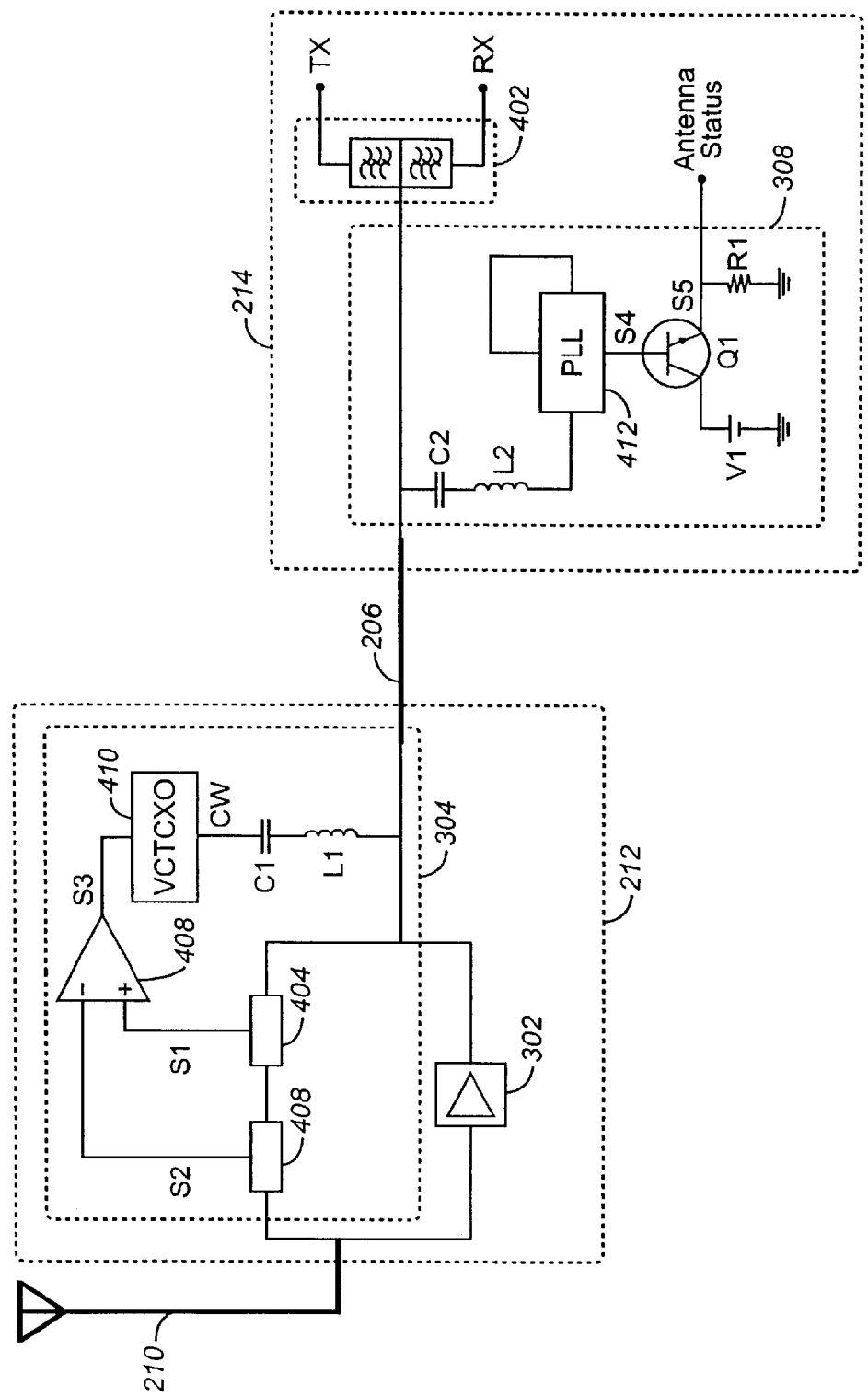
FIG. 4 shows a schematic representation of an antenna condition circuit as contemplated by the present invention.

FIG. 4 shows a schematic diagram of one embodiment of the antenna circuitry 212 and cabinet circuitry 214 as contemplated by the present invention. The antenna circuitry 212 contains a return loss detector 304 which measures the difference in signal power between a forward signal traveling to the antenna 210 and the reflected signal from the antenna. The measured difference is frequency modulated and is sent to the cabinet circuitry 214 via the feeder cable 206. At the cabinet circuitry 214, a return loss recovery circuit 308 restores the difference in signal power between the forward signal and the reflected signal.

The cabinet circuitry 214 typically includes a filter duplexer 402 which passes a transmit signal TX to the antenna 210 through the feeder cable 206. The filter duplexer 402 also outputs a receive signal RX from the antenna 210 for further processing by the base station. The receive signal RX from the antenna 210 may be amplified by a MHA 302 before reaching the filter duplexer 402.

A transmitted signal TX passes through the feeder cable 206 and the return loss detector 304 to the antenna 210. A forward-direction power detector 404 generates a forward power signal S1 which is proportional to the power level of the transmitted signal TX traveling to the antenna. A reverse-direction power detector 406 generates a reflected power signal S2 proportional to the power level of the reflected signal from the antenna. A differential amplifier 408 generates a return loss tuning signal S3 which is proportional to the difference between signal S1 and signal S2. Thus, a lower voltage at tuning signal S3 indicates a higher antenna return loss, and a higher voltage at tuning signal S3 indicates a lower antenna return loss value. As discussed earlier, a high return loss is generally an indication of antenna damage which must be repaired.

The differential amplifier 408 is coupled to a voltage controlled temperature compensated crystal oscillator (VCTCXO or VCO) 410. A VCTCXO outputs a frequency signal which varies according to an input signal voltage. Typically, the output frequency of a VCTCXO is independent of ambient temperature and has good aging characteristics, thereby minimizing frequency drift. The output of the VCTCXO 410 is a frequency modulated carrier signal CW which is controlled by the voltage level of the return loss tuning signal S3. In a particular embodiment of the present invention, the carrier signal CW is configured to have a very narrow frequency band.

The carrier signal CW from the detector VCTCXO 410 is inserted into the antenna feeder cable 206 through a very narrow band pass filter, such as the simple LC resonator of C1 and L1 shown. The feeder cable 206 is coupled to the cabinet circuitry 214, and supplies the carrier signal CW to the return loss recovery circuit 308.

The return loss recovery circuit 308, in essence, reverses the steps taken by the return loss detector 304 to recover the return loss tuning signal S3. First, a narrow band pass filter, such as the LC resonator of C2 and L2, is used to extract the carrier signal CW from the feeder cable 206. This band pass filter is configured to pass only those signals within the frequency range of the carrier signal CW from the VCTCXO 410.

The extracted carrier signal CW is then input to a phase locked loop (PLL) 412. A phase locked loop is a system that uses feedback to maintain an output signal in a specific phase relationship with a reference signal. In a specific embodiment of the present invention, a 74HC4046 PLL integrated circuit is used. As detailed further below, the PLL generates a recovery tuning signal S4 which tracks the return loss tuning signal S3, thereby restoring the return loss value determined in the return loss detector circuit 304.

In one embodiment of the present invention, recovery tuning signal S4 is coupled to a transistor Q1 such that an antenna status signal S5 is switched from a voltage V1 to ground when recovery tuning signal S4 falls below the transistor's threshold turn on level. In this manner, real-time monitoring to the antenna's operating condition can be performed. For example, when the antenna status signal S5 changes from V1 to ground, a signal may be transmitted to a technician alerting of possible antenna damage. The technician can then visit the base station and correct any antenna problems. It is contemplated that other embodiments of the present invention may send an antenna status signal with a more detailed representation of the antenna return loss level such that a gradual degradation in antenna performance may be monitored.

Figure 5:
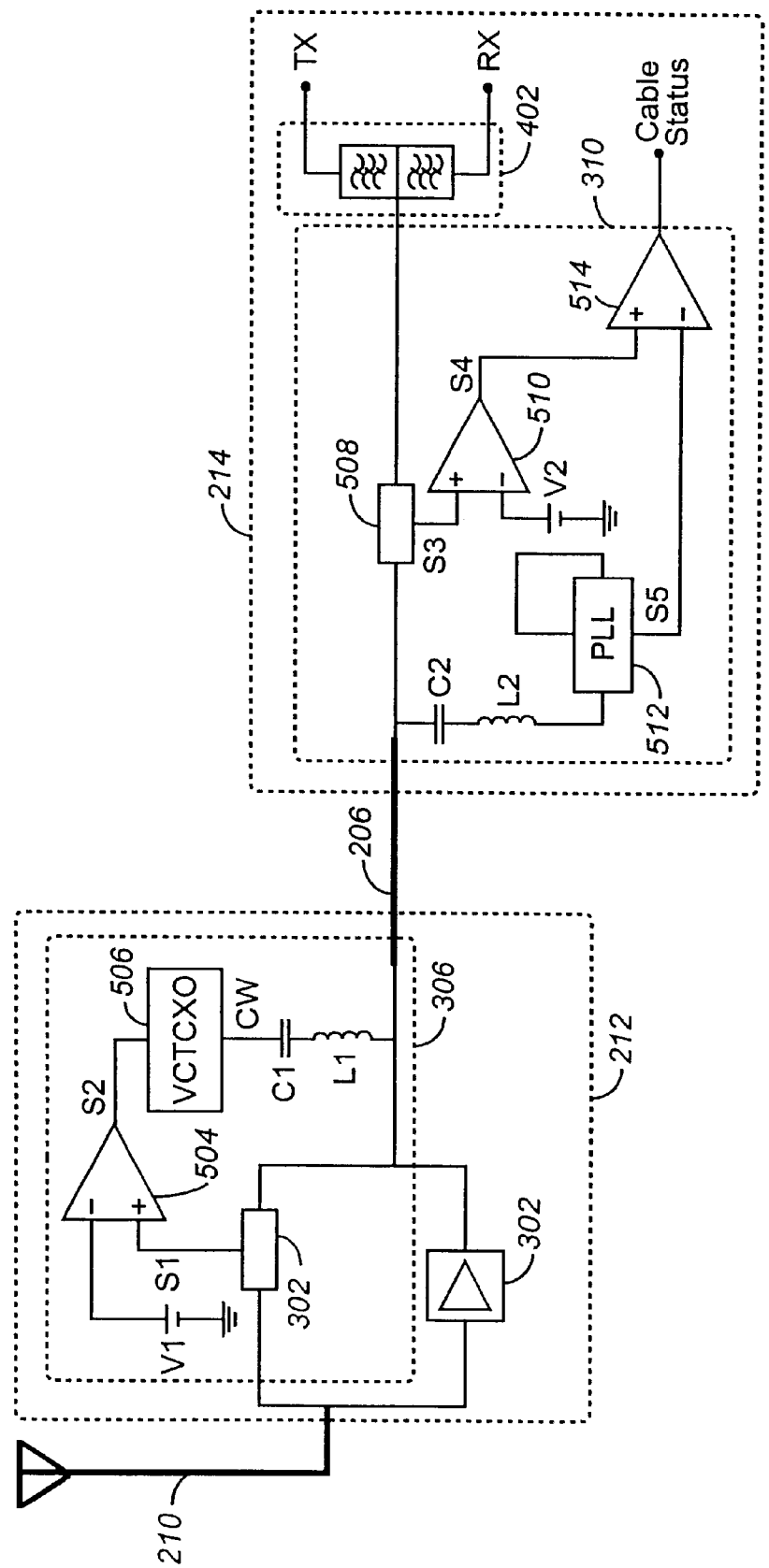
FIG. 5 shows a schematic representation of a feeder cable condition circuit as contemplated by the present invention.

In FIG. 5, a schematic diagram of another embodiment of the present invention is shown. The antenna circuitry 212 contains a cable loss detector 306 and cabinet circuitry 214 contains a cable loss recovery circuit 310. The cable loss detector 306 measures the power of a forward signal emerging from the feeder cable 206. The measured signal is then frequency modulated and is sent to the cable loss recovery circuit 310 via the feeder cable 206. The cable loss recovery circuit 310 restores the measured signal power at the antenna end of the feeder cable 206 and compares it to a measured signal power at the cabinet end of the feeder cable 206. The compared value is proportional to the amount of cable loss present in the feeder cable 206.

As previously described, a transmitted signal TX from the filter duplexer 402 is sent through the feeder cable 206 to the antenna 210. A forward-direction power detector 502 generates an antenna end power signal S1 which is proportional to the power level of the transmitted signal TX emerging from the feeder cable 206. A differential amplifier 504 compares the antenna end power signal S1 with a voltage reference V1 and amplifies the result to produce an antenna end cable loss tuning signal S2. Thus, the cable loss tuning signal S2 is proportional to the power level of the transmitted signal TX emerging from the feeder cable 206.

The differential amplifier 504 is coupled to a VCTCXO 506. The VCTCXO 506 outputs a frequency modulated carrier signal CW which is modulated by the voltage level of the cable loss tuning signal S2. Once again, the carrier signal CW is confined to a narrow frequency range and is inserted into the antenna feeder cable 206 through a very narrow band pass filter, such as the simple LC resonator of C1 and L1 shown. The feeder cable 206 is coupled to the cabinet circuitry 214, thereby supplying the carrier signal CW to the cable loss recovery circuit 310.

The cable loss recovery circuit 310 also measures the power level of the transmitted signal TX, however, this measurement is taken before the transmitted signal TX enters the feeder cable 206. Another forward-direction power detector 508 generates a cabinet end power signal S3 which is proportional to the power level of the transmitted signal TX before entering the feeder cable 206. A second differential amplifier 510 compares the cabinet end power signal S3 with a voltage reference V2 and amplifies the result to produce a cabinet end cable loss tuning signal S4. Thus, the cable loss tuning signal S4 produced is proportional to the power level of the transmitted signal TX before entering the feeder cable 206.

In addition, the cable loss recovery circuit 310 restores the antenna end cable loss tuning signal S2. A band pass filter, such as the LC resonator of C2 and L2, is used to extract the carrier signal CW from the feeder cable 206. The extracted carrier signal CW is then input to a phase locked loop (PLL) 512 which generates a recovery tuning signal S5. The recovery tuning signal S5 tracks the antenna end cable loss tuning signal S2.

Both the recovery tuning signal S5 and the cabinet end power signal S3 are coupled to a third differential amplifier 514. The third differential amplifier 514 subtracts the restored power level at the antenna end of the feeder cable 206 from the power level at the cabinet end of the feeder cable 206. In this manner, a cable status signal is output from the third differential amplifier 514 which is proportional the cable loss of the feeder cable 206.

Figure 6A:
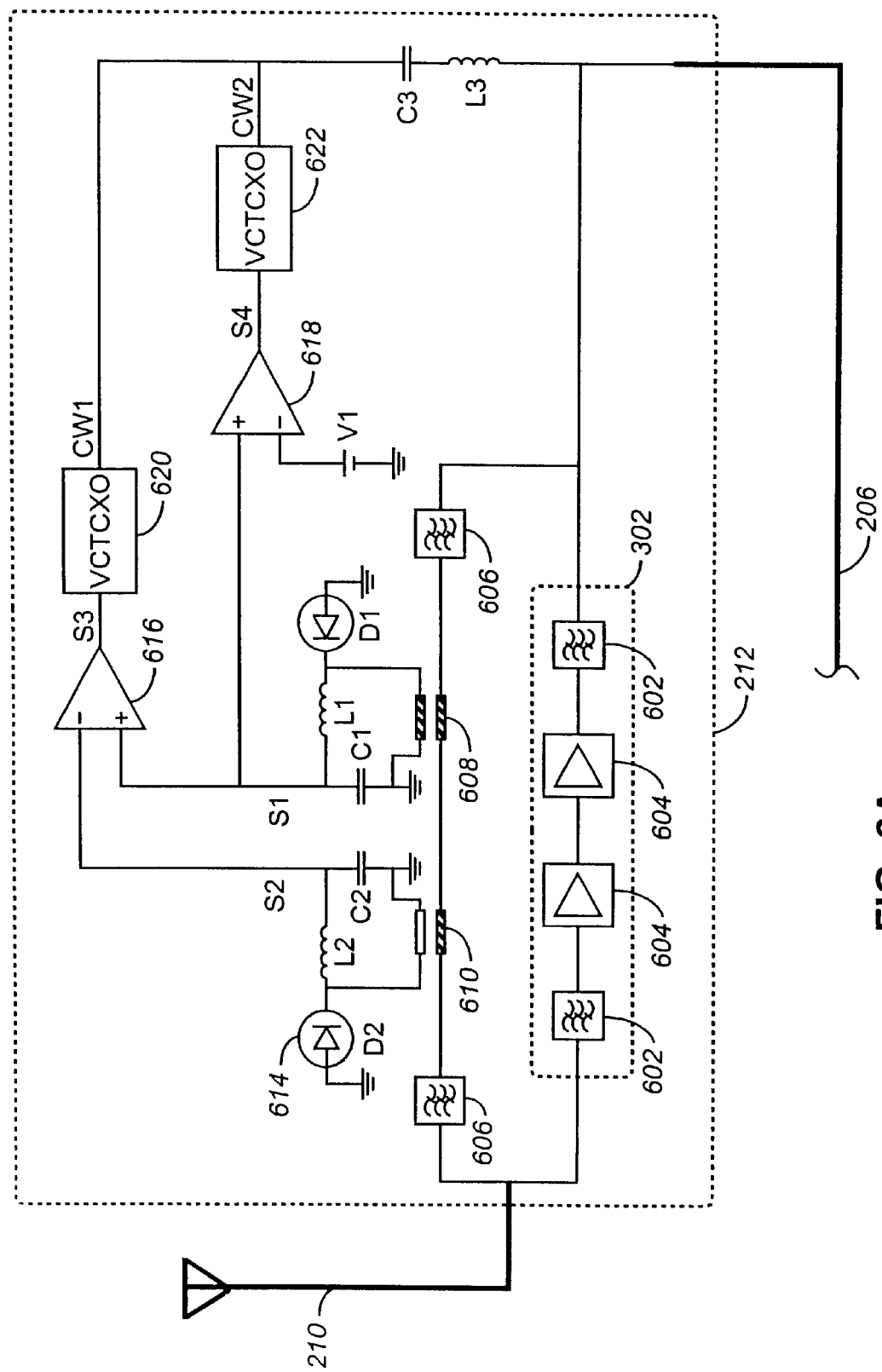
FIGS. 6A and 6B show a schematic representation of a combined antenna condition and feeder cable condition circuit as contemplated by the present invention.
Figure 6B:
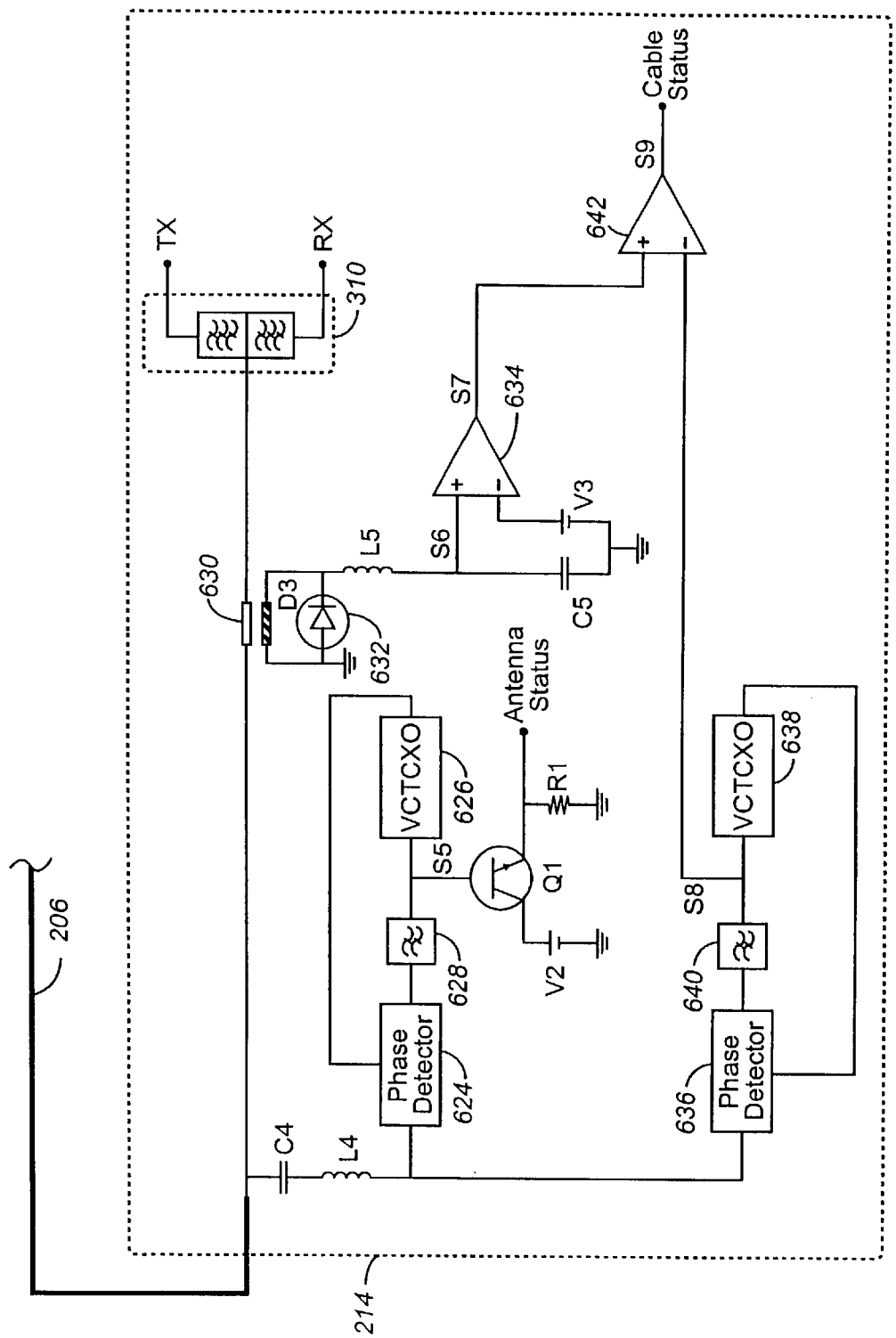

Referring now to FIG. 6A and FIG. 6B, a schematic representation of a preferred embodiment of the present invention is shown. In this embodiment, both the return loss and cable loss of the base station are determined. As mentioned earlier, the antenna 210 transmits and receives signals to and from mobile stations and is coupled to the antenna circuitry 212. Signals received by the antenna 210 from the mobile stations (reverse-link signals) may be amplified by a MHA 302, if present. In base stations with high antenna cable loss (e.g. a long feeder cable), the MHA 302 serves to amplify incoming signals so they have enough power to travel through the feeder cable 206 to the cabinet circuitry 214. The MHA 302 typically includes MHA filters 602 and MHA amplifiers 604 configured to reduce background noise and boost input signal power. The MHA's output is passed through the antenna feeder cable 206 and is received by a filter duplexer 402. A receive filter portion of the filter duplexer 402 outputs a RX signal for further processing by the base station.

The antenna circuitry 212 includes a first radio frequency (RF) directional coupler 608 and second RF directional coupler 610. The first RF coupler 608 is configured to detect forward signals traveling from a transmit portion of the filter duplexer 402 to the antenna 210. The second RF coupler 610 is configured to detect reflected signals traveling from the antenna 210 back to the feeder cable 206.

A first power diode detector 612, in combination with the first RF coupler 608 and a LC filter comprising an inductor L1 and capacitor C1, provides a forward power level signal S1. The forward power level signal is coupled to a non-inverting input of a first differential amplifier 616 and a second differential amplifier 618. Thus, the signal S1 is a DC voltage level representing the forward-link signal power level emerging from the base station feeder cable 206.

A second power diode detector 614, in combination with the second RF coupler 610 and a LC filter comprising an inductor L2 and capacitor C2, provides a reflected power level signal S2 to an inverting input of the first differential amplifier 616. Thus, the signal S2 at the inverting input of the differential amplifier 616 is a DC voltage level representing the reflected signal power level from the antenna 210.

The first differential amplifier 616 subtracts the reflected signal power level S2 present at its inverting input from the forward signal power level S1 at its non-inverting input. The differential amplifier 616 amplifies the difference between S1 and S2, and the resulting difference is presented as a return loss detector tuning signal S3 at its output.

The return loss detector tuning signal S3 is a DC voltage level representing the return loss of the antenna 210. For example, where no return loss exists (i.e. antenna is functioning properly) the return loss detector tuning signal S3 may be 4.5 volts. Where there is a large reflection of the forward signal (i.e. antenna broken) the detector tuning signal S3 may be 0.5 volts. As mentioned earlier, return loss typically results from impedance mismatching between the antenna and the signal source, and is used as an indicator of antenna damage. Thus, a smaller DC voltage level at the tuning signal S3 indicates more pronounced antenna damage.

The return loss detector tuning signal S3 is passed to a return loss detector VCTCXO 620 which generates a frequency modulated first carrier signal CW1. Since the return loss detector tuning signal S3 from the differential amplifier 616 is proportional to the detected difference in transmitted and reflected power levels, the frequency of the first carrier signal CW1 generated by the return loss detector VCTCXO 620 is frequency dependent on the DC voltage of S3. In a particular embodiment of the present invention, the frequency range of the return loss detector VCTCXO 620 is designed to be very small; only some 10ths of parts per million (ppm's). Thus, the first carrier signal CW1 has a very narrow frequency band. For example, the first carrier signal CW1 may be selected to be 10.00007 MHz when the return loss detector tuning signal S3 is at 0.5V, and 10.00008 MHz when the return loss detector tuning signal S3 is at 4.5V.

As earlier mentioned, the forward power level signal S1 is also coupled to the non-inverting input of the second differential amplifier 618. A voltage reference V1 is coupled to the inverting input of the second differential amplifier 618 and is subtracted from the forward power level signal S1. Thus, the second differential amplifier 618 produces a cable loss tuning signal S4 which is proportional in voltage to the power level of the transmitted signal TX after passing through the feeder cable 206.

The cable loss tuning signal S4 is input to a cable loss VCTCXO 622. The cable loss VCTCXO 622 provides a frequency modulated second carrier signal CW2, with the frequency dependent on the voltage of the forward power level signal S1. As was the case for the first carrier signal CW1, the second carrier signal CW2 is configured to have a very narrow frequency band. The frequency range of the second carrier signal CW2 is preferably chosen to be different than the frequency range of the first carrier signal CW1.

The first carrier signal CW1 and the second carrier signal CW2 are inserted into the antenna feeder cable 206 through a narrow band pass filter, such as the simple LC resonator of C3 and L3. The band pass filter should be designed to advance signals having frequency ranges of both the first carrier signal CW1 and the second carrier signal CW2. It is also important to note that the frequency ranges of the first carrier signal CW1 and the second carrier signal CW2 should be selected so as to not overlap frequencies used by other signals passing through the feeder cable 206. Otherwise, the other signals present on the feeder cable 206 might interfere with carrier signals CW1 and CW2 and cause inaccurate antenna and cable status readings.

As shown in FIG. 6B, the feeder cable 206 is coupled to the cabinet circuitry 214. The cabinet circuitry 214 includes a narrow band pass filter, such as that of C4 and L4, which extracts the first carrier signal CW1 and the second carrier signal CW2 from the feeder cable 206.

The extracted carrier signals CW1 and CW2 are input to phase locked loops configured to recover the return loss tuning signal S3 and the cable loss tuning signal S4. A first phase locked loop is created by a return loss phase detector 624 and a return loss recovery VCTCXO 626. The return loss recovery VCTCXO 626 is matched to the return loss detector VCTCXO 620 such that the phase locked loop is responsive to only the first carrier signal CW1.

The phase detector 624 produces an output voltage signal proportional to the phase difference of its two input signals. The first input signal of the return loss phase detector 624 is coupled to the extracted signal from the narrow band pass filter of C4 and L4. The second input signal of the phase detector 624 is coupled to the output of the return loss recovery VCTCXO 626. The resulting output voltage signal of the phase detector 624 is connected to a return loss low pass filter 628 which removes any high frequency noise present.

The output from the return loss low pass filter 628 is a return loss recovery tuning signal S5 coupled to the input of the return loss recovery VCTCXO 626. A feedback loop is created by returning the output signal of the recovery VCTCXO 626 to the second input of the phase detector 624. In this manner, the recovery VCTCXO 626 is configured to track the frequency of the first carrier signal CW1. In addition, the return loss recovery tuning signal S5 of the VCTCXO 626 tracks the return loss detector tuning signal S3 of the return loss VCTCXO 620, and thereby restoring the antenna return loss value derived in the antenna detector circuit 304.

As earlier described, the return loss recovery tuning signal S5 may be coupled to a transistor Q1 such that an antenna status signal is switched from a voltage V2 to ground when the return loss recovery tuning signal S5 falls below the transistor's threshold turn on level.

Figure 7:
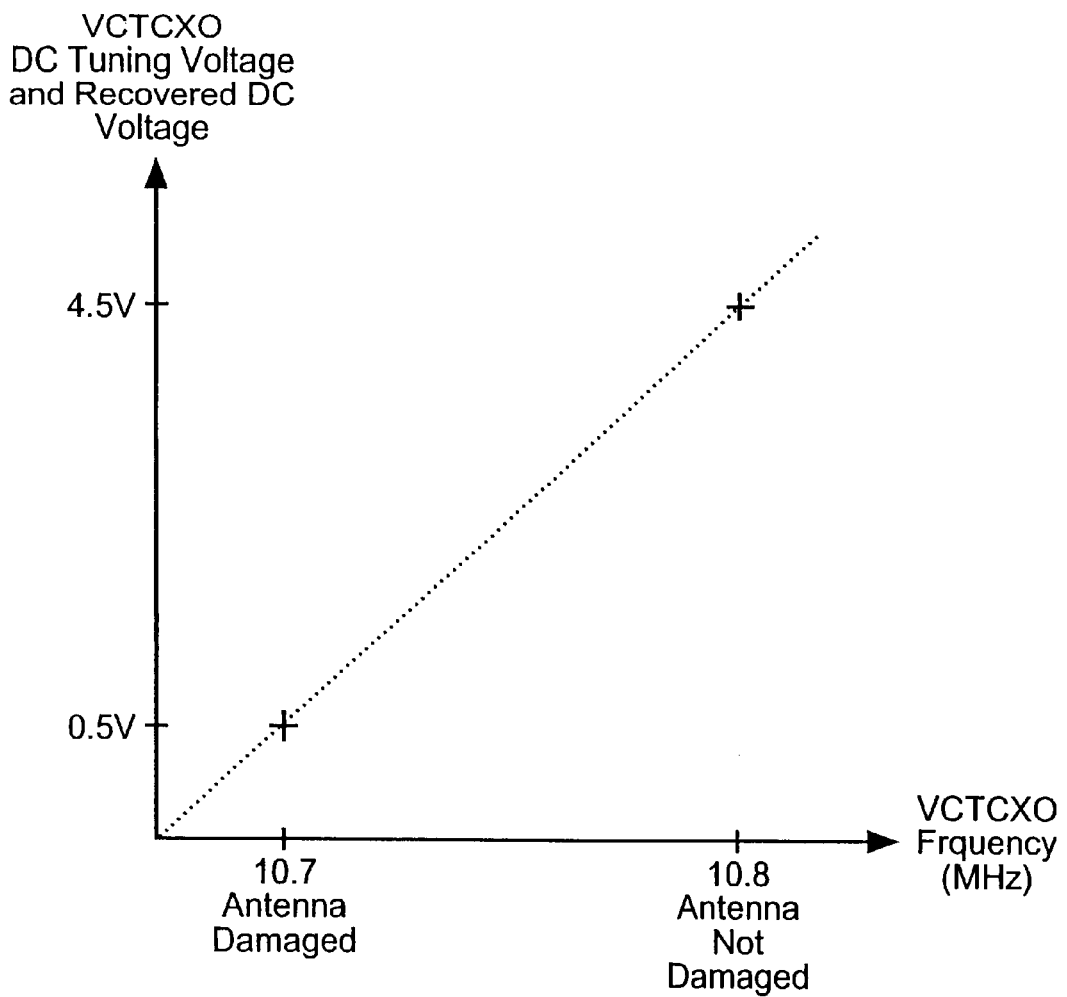
FIG. 7 is a graph detailing the operation of the antenna condition circuit.

Turning now to FIG. 7, a graph is shown detailing the operation of the return loss detector circuit and the return loss recovery circuit described above. The graph's x-axis is the frequency range of both the return loss detector VCTCXO 620 at the antenna circuitry 312 and the return loss recovery VCTCXO 626 at the cabinet circuitry 214. For convenience, a large frequency range (10.7 MHz to 10.8 MHz) is chosen to describe the operation of the present invention, however, it is contemplated that a narrower frequency range is used in a preferred embodiment. The graph's y-axis is the voltage level of both the return loss detector tuning signal S3 input to the return loss detector VCTCXO 620 and the return loss recovery tuning signal S5 input to the return loss recovery VCTCXO 626.

As shown, the return loss detector tuning signal S3 varies, for example, from 0.5V to 4.5V. When the detector tuning signal S3 is at 4.5V, there are little or no reflected signals from the antenna 210, thus indicating an undamaged antenna condition. Since the detector tuning signal S3 is coupled to the return loss detector VCTCXO 620, the 4.5V input level is converted, for example, into a 10.8 MHz first carrier signal CW1 by the detector VCTCXO 620.

As described above, the first carrier signal CW1 is passed through the feeder cable 206 to the cabinet circuitry 214, where the first carrier signal CW1 is extracted from the feeder cable 206. The return loss recovery VCTCXO 626 is tuned to the same frequency as the return loss detector VCTCXO 620 by means of a phase locked loop. The phase locked loop also produces a return loss recovery tuning signal S5 equal to the return loss detector tuning signal S3. Therefore, the graph of FIG. 7 also describes the relationship between the return loss recovery tuning signal S5 and the return loss recovery VCTCXO 626 frequency.

When damage to the antenna 210 occurs, the frequencies of both the return loss detector VCTCXO 620 and return loss recovery VCTCXO 626 shifts from 10.8 MHz to 10.7 MHz, as shown in the graph. In the cabinet circuitry 214, the return loss recovery tuning signal S5 is utilized to indicate this frequency change and alert the base station operator of possible antenna damage.

The present invention therefore allows for real time detection of base station antenna damage without requiring manual antenna measurements by a technician. The invention helps reduce the need to climb up antenna towers in order to determine whether antenna damage is present and helps reduce base stations maintenance costs. The invention does not rely on monitoring base station cellular traffic to detect antenna damage, therefore it can be used to detect slowly occurring antenna failures and antenna failures in rural areas.

Returning to FIG. 6B, the cabinet circuitry 214 includes a RF directional coupler 630 configured to detect forward signals originating from the filter duplexer 402 before they enter the feeder cable 206. A power diode detector 632, in combination with the RF coupler 630 and a LC filter comprising an inductor L5 and capacitor C5, provides a power signal S6 to a non-inverting input of a differential amplifier 634. The differential amplifier 634 compares the power signal S6 with a voltage reference V3 and amplifies the result to produce a cabinet end cable loss signal S7. Thus, the cabinet end cable loss signal S7 produced is proportional to the power level of the transmitted signal TX before entering the feeder cable 206.

In addition, the cabinet circuitry 214 includes a second phase locked loop created by a cable loss phase detector 636 and a cable loss recovery VCTCXO 638. The cable loss recovery VCTCXO 638 is matched to the cable loss detector VCTCXO 622 such that the phase locked loop is responsive to only the second carrier signal CW2.

The second phase locked loop functions in a similar manner to the first phase locked loop described above. Specifically, the cable loss phase detector 636 produces an output voltage signal proportional to the phase difference of its two input signals. The first input signal of the cable loss phase detector 636 is coupled to the extracted signal from the narrow band pass filter of C4 and L4. The second input signal of the phase detector 636 is coupled to the output of the cable loss recovery VCTCXO 638. The resulting output voltage signal of the phase detector 636 is connected to a cable loss low pass filter 640 which removes any high frequency noise present.

The output from the cable loss low pass filter 636 is a cable loss recovery tuning signal S8 coupled to the input of the cable loss recovery VCTCXO 638. A feedback loop is created by returning the output signal of the recovery VCTCXO 638 to the second input of the phase detector 636. In this manner, the recovery VCTCXO 638 is configured to track the frequency of the second carrier signal CW2. In addition, the cable loss recovery tuning signal S8 of the VCTCXO 638 tracks the cable loss detector tuning signal S4 of the cable loss VCTCXO 622, thereby restoring the signal proportional to the power level of the transmitted signal TX after passing through the feeder cable 206.

The transmitted signal's power level before entering the feeder cable (signal S7) and the transmitted signal's power level after exiting the feeder cable (signal S8) are coupled to a differential amplifier 642. The differential amplifier 642 subtracts the power level of the transmitted signal exiting the feeder cable 206 from the power level of the transmitted signal entering the feeder cable 206 to produce a cable status signal S9 which is proportional to the amount of cable loss present in at the feeder cable 206.

The cable status signal S9 can be utilized for real-time monitoring to the feeder cable's operating condition. For example, when the cable status signal S9 increases above a defined threshold value, a signal may be transmitted to a technician alerting of possible feeder cable damage. The technician can then visit the base station and correct any feeder cable problems. It is contemplated that other embodiments of the present invention may send an cable status signal with a detailed representation of the cable loss level such that a gradual degradation in feeder cable performance may be monitored.

It will be appreciated that, although various embodiments of the invention have been described herein for purposes of illustration, modifications may be made without departing from the spirit and scope of the invention. In addition, it will be appreciated by those skilled in the art that equivalent devices or steps may be substituted for those described, which operate according to principles of the present invention and thus fall within the scope of the claims. For example, the power diode detectors in the present invention circuit may be substituted with thermoelectric detectors. Thus, any equivalent method or device operating according to principles of the invention is considered to fall within the scope thereof.

The invention claimed is:

1. A base station including an antenna coupled to a cabinet through a feeder cable, the base station comprising:
    an antenna forward signal power detector adapted to output an antenna forward power signal for signals traveling from the cabinet to the antenna;
    an antenna reflected signal power detector adapted to output an antenna reflected power signal for signals traveling from the antenna to the cabinet;
    an antenna return loss signal proportional to a difference between said antenna forward power signal and said antenna reflected power signal;
    a return loss oscillator configured to modulate said antenna return loss signal, said oscillator coupled to the feeder cable; and
    a cabinet circuit coupled to the feeder cable, said cabinet circuit configured to restore said antenna return loss signal.

2. The base station of claim 1, further including a return loss differential amplifier having a first amplifier input coupled to said antenna forward power signal and a second amplifier input coupled to said antenna reflected power signal, said return loss amplifier having an amplifier output coupled to said antenna return loss signal.

3. The base station of claim 1, wherein said antenna forward signal power detector includes a first RF coupler and said antenna reflected signal power detector includes a second FR coupler.

4. The base station of claim 1, wherein said return loss oscillator is a voltage controlled oscillator.

5. The base station of claim 1, wherein said cabinet circuit includes a return loss phase locked loop.

6. The base station of claim 1, further including an antenna filter having an input coupled to said return loss oscillator and an output coupled to the feeder cable, said return loss filter configured to pass a frequency range of said return loss oscillator.

7. The base station of claim 1, further including a cable loss oscillator configured to modulate said antenna forward power signal, said cable loss oscillator coupled the feeder cable.

8. The base station of claim 7, further including a cable loss differential amplifier having a first amplifier input coupled to said antenna forward power signal and a second amplifier input coupled to a voltage reference, said cable loss amplifier having an amplifier output coupled to said cable loss oscillator.

9. The base station of claim 7, wherein said cabinet circuit includes a cabinet forward signal power detector adapted to output a cabinet forward power signal for signals traveling from the cabinet to the antenna.

10. The base station of claim 9, wherein said a cabinet circuit is configured to restore said antenna forward power signal.

11. The base station of claim 10, wherein said cabinet circuit includes an cable loss status signal proportional to a difference between said cabinet forward power signal and said restored antenna forward power signal.

12. The base station of claim 10, wherein said cabinet circuit includes a cable loss phase locked loop.

13. A base station including a feeder cable, the feeder cable having an antenna end and a cabinet end, the base station comprising:

an antenna power detector adapted to output an antenna power signal, said antenna power detector positioned proximate the antenna end of the feeder cable;

an ending cable loss signal proportional to a difference between said antenna power signal and an antenna voltage reference;

a cable loss oscillator configured to modulate said ending cable loss signal, said oscillator coupled to the antenna end of the feeder cable; and a cabinet circuit coupled to the cabinet end of the feeder cable, said cabinet circuit configured to restore said ending cable loss signal.

14. The base station of claim 13, wherein said cabinet circuit includes:

a cabinet power detector adapted to output a cabinet power signal, said cabinet power detector positioned proximate the cabinet end of the feeder cable; and a beginning cable loss signal proportional to a difference between said cabinet power signal and a cabinet voltage reference.

15. The base station of claim 14, wherein said cabinet circuit includes a cable loss status signal proportional to a difference between said beginning cable loss signal and said ending cable loss signal.

16. The base station of claim 15, further including a cabinet differential amplifier having a first amplifier input coupled to said beginning cable loss signal and a second amplifier input coupled to said ending cable loss signal, said cabinet differential amplifier having an amplifier output coupled to said cable loss status signal.

17. The base station of claim 13, wherein said cabinet circuit includes a cable loss phase locked loop.

18. A base station including an antenna coupled to a cabinet through a feeder cable, the base station comprising:

a first RF coupler configured to detect forward signals traveling from the cabinet to the antenna;

a second RF coupler configured to detect reflected signals traveling from the antenna to the cabinet;

a first power detector coupled to said first RF coupler configured to provide a forward power signal of said forward signals;

a second power detector coupled to said second RF coupler configured to provide a reflected power signal of said reflected signals;

a comparator including a first comparator input coupled to said forward power signal and a second comparator input coupled to said reflected power signal, said comparator providing a detector tuning signal which is an amplified difference between said forward power signal and said reflected power signal; and a detector voltage controlled oscillator including a detector oscillator input coupled to said detector tuning signal and a detector oscillator output signal coupled to the feeder cable.

19. The base station of claim 18, further comprising a detector band filter including a detector band filter input coupled to said detector oscillator output signal and a detector band filter output coupled to the feeder cable, wherein said detector band filter inserts said detector oscillator output signal into the feeder cable.

20. The base station of claim 18, further comprising a mast head amplifier including a mast head amplifier input coupled to the antenna and a mast head amplifier output coupled to the feeder cable, wherein said mast head amplifier is configured to amplify signals received by the antenna.

21. The apparatus of claim 18, wherein said comparator is a differential amplifier.

22. The apparatus of claim 18, wherein said detector voltage controlled oscillator is a voltage controlled temperature compensated crystal oscillator.

23. The apparatus of claim 18, wherein said first RF coupler and said second first RF coupler are proximate the antenna.

24. The apparatus of claim 18, further comprising:

a phase detector including a first phase detector input, a second phase detector input, and phase detector output, said first phase detector input is coupled to the feeder cable, and said phase detector output providing a recovery tuning signal proportional to a phase difference between said first phase detector input and said second phase detector input; and a recovery voltage controlled oscillator including a recovery oscillator input coupled to said recovery tuning signal and an recovery oscillator output coupled to said second phase detector input;

whereby said phase detector and said recovery voltage controlled oscillator form a phase locked loop such that said recovery tuning signal tracks said detector tuning signal.

25. The apparatus of claim 24, further comprising a recovery band filter including a recovery band filter input coupled to the feeder cable and a recovery band filter output coupled to said first phase detector input, wherein said recovery band filter extracts said detector oscillator output signal from the feeder cable.

26. The apparatus of claim 24, wherein said phase detector and said recovery voltage controlled oscillator are associated with the cabinet.

27. The apparatus of claim 24, wherein said recovery voltage controlled oscillator is a voltage controlled temperature compensated crystal oscillator.

28. An antenna detector circuit for providing an antenna condition signal of an antenna, wherein the antenna is coupled to a feeder cable, the antenna detector circuit comprising:

a first RF coupler configured to detect forward signals traveling to the antenna;

a second RF coupler configured to detect reflected signals traveling from the antenna;

a first power detector coupled to said first RF coupler configured to provide a forward power signal of said forward signals;

a second power detector coupled to said second RF coupler configured to provide a reflected power signal of said reflected signals;

a differential amplifier including a non-inverting input coupled to said forward power signal and an inverting input coupled to said reflected power signal, said differential amplifier providing a tuning signal which is an amplified difference between said forward power signal and said reflected power signal;

a voltage controlled oscillator including a oscillator input coupled to said tuning signal and a oscillator output coupled to the feeder cable.

29. The antenna detector circuit of claim 28, further comprising a band filter including a band filter input coupled to said oscillator output signal and a band filter output coupled to the feeder cable, wherein said band filter inserts said oscillator output signal into the feeder cable.

30. A detector recovery circuit for providing an antenna status of an antenna coupled to a feeder cable, wherein a return loss signal is added to the feeder cable as a frequency modulated signal, the antenna detector circuit comprising:

a phase detector including a first phase detector input, a second phase detector input, and phase detector output, said phase detector input is coupled to the feeder cable, said phase detector output providing a tuning signal proportional to a phase difference between said first phase detector input and said second phase detector input; and a voltage controlled oscillator including a oscillator input coupled to said tuning signal and a oscillator output coupled to said second phase detector input;

whereby said phase detector and said voltage controlled oscillator form a phase locked loop such that said tuning signal tracks the return loss signal.

31. The detector recovery circuit of claim 30, further comprising a band filter including a band filter input coupled to the feeder cable and a band filter output coupled to said first phase detector input, wherein said band filter extracts signals within the frequency range of the return loss signal from the feeder cable.

32. A method for providing an antenna condition signal to a cabinet coupled to an antenna by a feeder cable, the method comprising:

detecting the power level of a forward signal traveling to the antenna;

detecting the power level of a reflected signal traveling from the antenna;

forming a detector signal responsive to a difference between said power level of said forward signal and said power level of said reflected signal;

tuning a carrier signal to a frequency responsive to said detector signal; and applying said carrier signal into the feeder cable.

33. The method of claim 32, further comprising:

extracting said carrier signal from the feeder cable; and recovering said detector signal responsive from said carrier signal.

34. The method of claim 33, wherein the operation of recovering said detector signal includes:

forming a recovered signal responsive to a difference in phase between said extracted carrier signal and a reference signal; and tuning said reference signal to a frequency responsive to said recovered signal.

35. A method for providing an cable condition signal of a feeder cable, the feeder cable having an antenna end and a cabinet end, the method comprising:

detecting a first power level of a forward signal proximate the antenna end of the feeder cable;

forming a first cable loss signal responsive to a difference between said detected first power level of said forward signal and a first voltage reference;

tuning a carrier signal to a frequency responsive to said first cable loss signal; and applying said carrier signal into the feeder cable.

36. The method of claim 34, further comprising:

extracting said carrier signal from said feeder cable;

recovering said first cable loss signal from said carrier signal;

detecting a second power level of said forward signal proximate the cabinet end of the feeder cable;

forming a second cable loss signal responsive to a difference between said detected second power level of said forward signal and a second voltage reference; and forming a feeder cable status signal proportional to a difference between said second cable loss signal and said recovered first cable loss signal.

\* \* \* \* \*